United States Patent [19]

Bosshart

[11] Patent Number: 5,442,325
[45] Date of Patent: Aug. 15, 1995

[54] VOLTAGE-CONTROLLED OSCILLATOR AND SYSTEM WITH REDUCED SENSITIVITY TO POWER SUPPLY VARIATION

[75] Inventor: Patrick W. Bosshart, Plano, Tex.

[73] Assignee: Texas Instruments Incorporated, Dallas, Tex.

[21] Appl. No.: 133,497

[22] Filed: Oct. 8, 1993

[51] Int. Cl.⁶ .............................................. H03B 5/04
[52] U.S. Cl. ..................... 331/57; 331/1 A;
  331/74; 331/173; 331/8; 331/186
[58] Field of Search ................ 331/57, 74, 175, 176,
  331/1 A, 173, 185, 186; 307/591

[56] References Cited

U.S. PATENT DOCUMENTS

| | | | |
|---|---|---|---|
| 3,914,711 | 10/1975 | Carlson et al. | 331/108 D |
| 3,973,222 | 8/1976 | Kucharewski | 331/111 |
| 4,110,701 | 8/1978 | Medwin | 331/1 A |
| 4,344,003 | 8/1982 | Harmon et al. | 307/296 A |
| 4,365,212 | 12/1982 | Gentile et al. | 331/111 |
| 4,565,976 | 1/1986 | Campbell | 331/57 |
| 4,686,489 | 8/1987 | Caspell | 331/57 |
| 4,737,670 | 4/1988 | Chan | 307/602 |
| 4,845,390 | 7/1989 | Chan | 307/602 |
| 4,853,654 | 8/1989 | Sakurai | 331/57 |
| 4,870,383 | 9/1989 | Nordholt | 331/116 R |
| 4,891,609 | 1/1990 | Eilley | 331/57 |
| 5,061,907 | 10/1991 | Rasmussen | 331/57 |
| 5,175,512 | 12/1992 | Self | 331/57 |
| 5,180,991 | 1/1993 | Takashima | 331/1 A |
| 5,180,995 | 1/1993 | Hayashi et al. | 331/57 |

FOREIGN PATENT DOCUMENTS 0084657  3/1989  Japan ........................... 331/57

*Primary Examiner*—Robert J. Pascal
*Assistant Examiner*—Arnold Kinkead
*Attorney, Agent, or Firm*—Richard L. Donaldson; William E. Hiller; James C. Kesterson

[57] ABSTRACT

The voltage-controlled oscillator (VCO) of the present invention is designed with reduced sensitivity to power supply voltage variations. The VCO includes multiple inverter stages with dc supply inputs tied to a filtered control dc signal, and a disabling circuit for disabling oscillation. The disabling circuit includes a disabling gate connected to the input to said inverter stages and an enabling gate connecting to the output of the inverter stages for enabling transmission of output from the VCO.

12 Claims, 4 Drawing Sheets

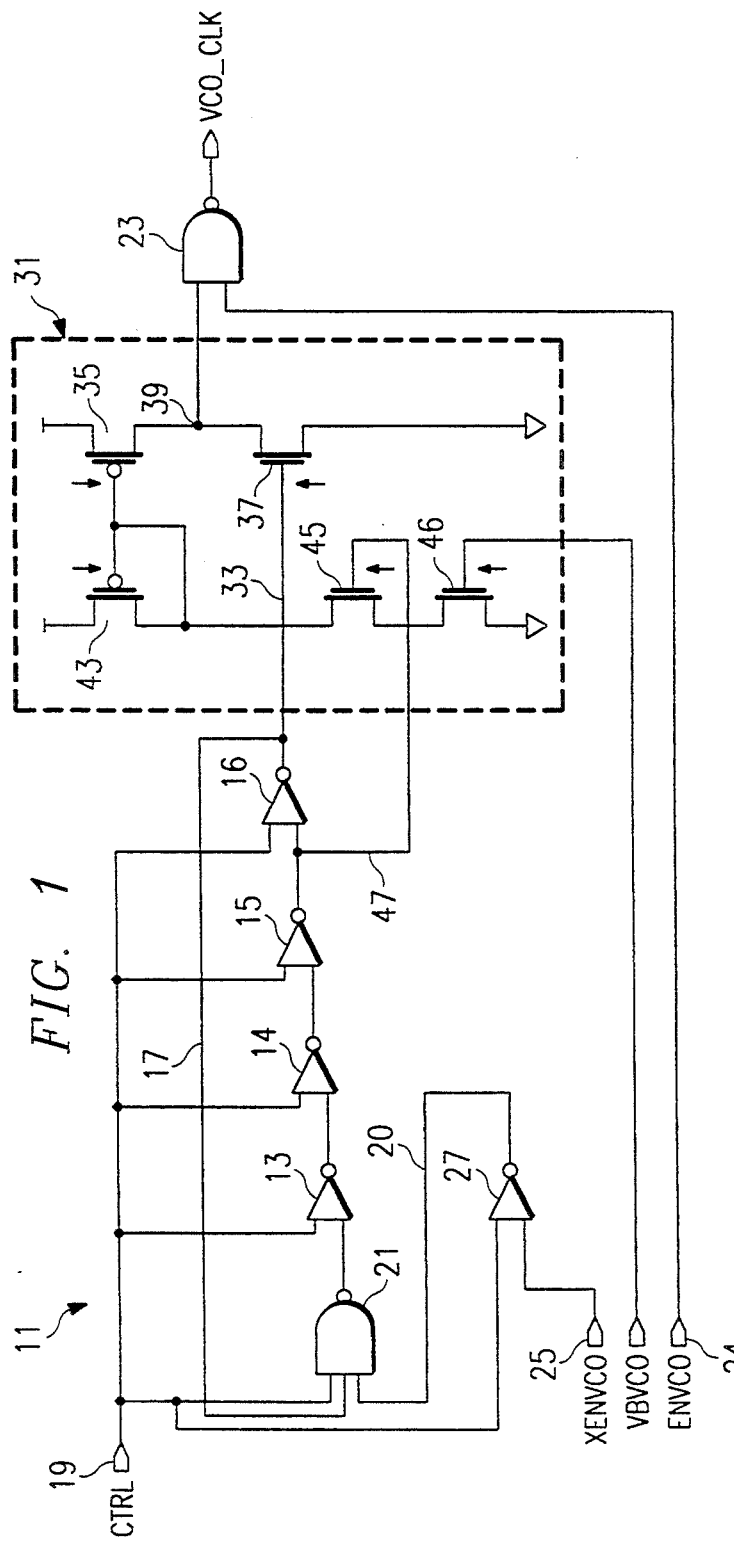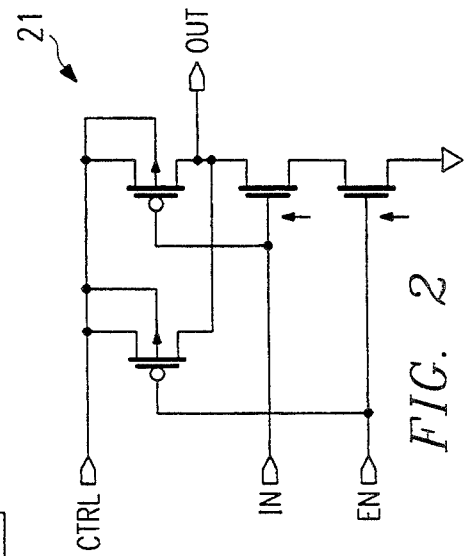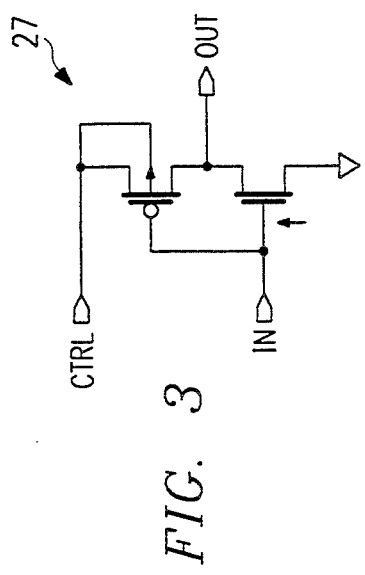

VOLTAGE-CONTROLLED OSCILLATOR AND SYSTEM WITH REDUCED SENSITIVITY TO POWER SUPPLY VARIATION

NOTICE

Copyright ©, Texas Instruments Incorporated, 1993. A portion of the Disclosure of this patent document contains material which is subject to copyright protection. The copyright owner has no objection to facsimile reproduction by anyone of the patent document or the patent disclosure, as it appears in the U. S. Patent and Trademark Office, patent file or records, but otherwise reserves all rights in its copyright whatsoever.

TECHNICAL FIELD OF THE INVENTION

The invention relates to synchronizing clock generators for data processing systems, and more specifically relates to a voltage-controlled oscillator principally for use with a phase-locked loop circuit.

BACKGROUND OF THE INVENTION

In the prior art, the voltage-controlled oscillator (VCO) has undesirable gain coefficients with respect to power supply variations which change the frequency of oscillation of the VCO. When the VCO in a phase-locked loop (PLL) unilaterally changes its frequency, the PLL feedback loop must correct this aberration. Since the unity gain frequency of the PLL feedback is low compared to the oscillating frequency of the VCO, many cycles elapse before the error is eliminated. It is a standard practice in PLL design to utilize a VCO which is as insensitive as possible to variations in the power supply voltage; however, there is a continuing need for improved VCO's with immunity to power supply voltage variations.

SUMMARY OF THE INVENTION

The voltage-controlled oscillator (VCO) of the present invention is designed to overcome some of the aforementioned difficulties with VCO performance by providing a device with reduced sensitivity to power supply voltage variations. The VCO includes multiple inverter stages with dc supply inputs tied to a filtered control dc signal and a disabling circuit for disabling oscillation. The disabling circuit includes a disabling gate connected to the input to said inverter stages and an enabling gate connecting to the output of the inverter stages.

BRIEF DESCRIPTION OF THE DRAWINGS

For a more complete understanding of the present invention and the advantages thereof, reference is now made to the following descriptions taken in conjunction with the accompanying drawings, in which:

FIG. 1 is a preferred embodiment of the VCO of the present invention;

FIG. 2 depicts the circuitry of the NAND gate within the VCO.

FIG. 3 is a schematic of an inverter depicted as a stage in FIG. 1.

DETAILED DESCRIPTION OF THE INVENTION

Figure 4:
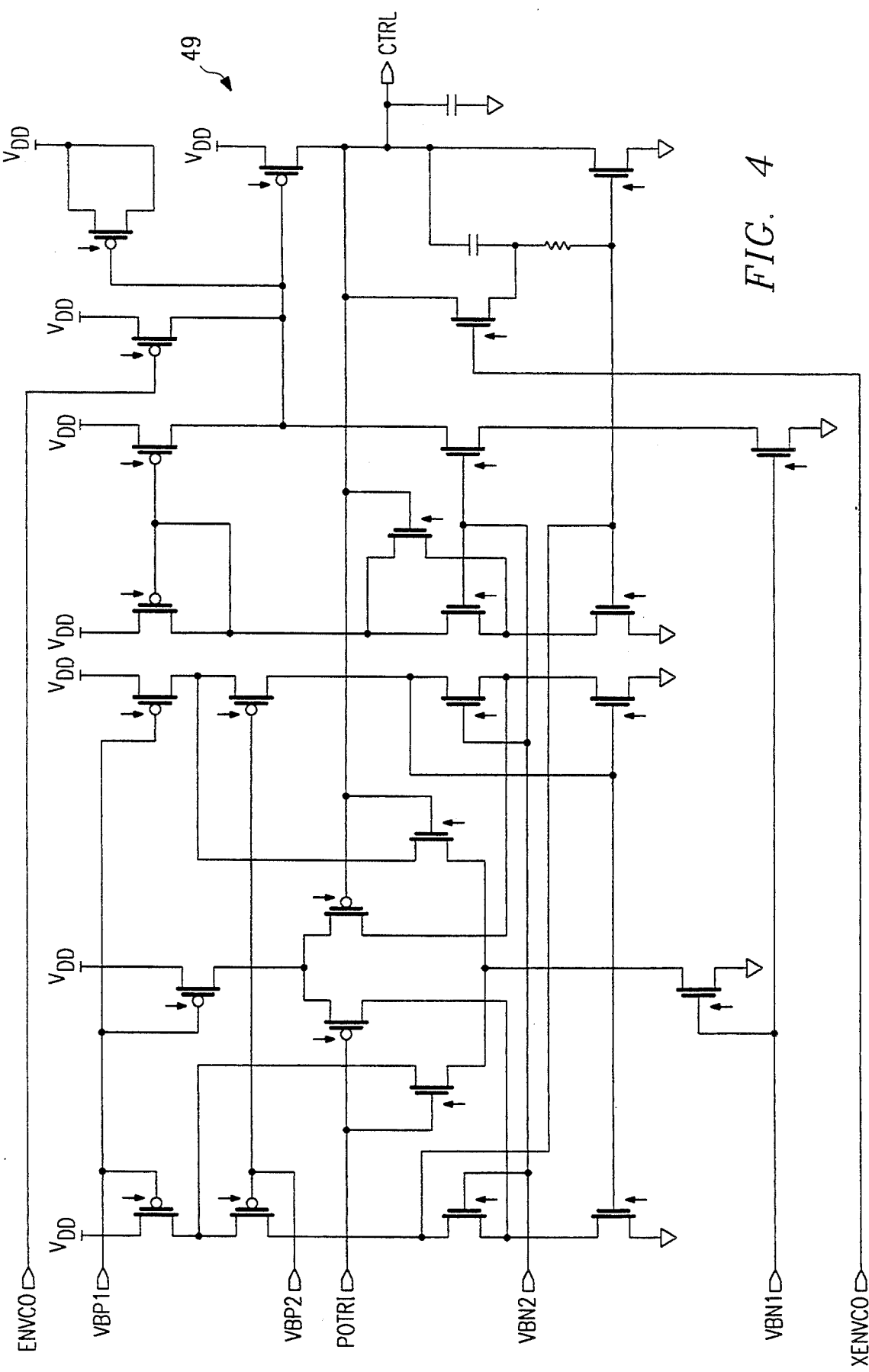
FIG. 4 is a driver OPAMP schematic.

Referring to FIG. 1, a voltage-controlled oscillator (VCO) 11 with reduced sensitivity to power supply voltage variations is shown in the preferred embodiment. The VCO includes a series of inverter stages 13, 14, 15, 16 with a feedback loop 17. The inverter DC supply is provided through control input 19. The DC signal provided to input 19 is received through the output of an OPAMP as shown in FIG. 4.

The VCO further includes a disabling circuit for disabling oscillation. The disabling circuit includes a disabling NAND gate 21 (detailed in FIG. 2) connecting to an input of the inverter stages, and a level shifter 31 for translating the low voltage swings on the VCO outputs (33 and 47) to full $V_{DD}$ signal swing at the output 39 of the level shifter, an enabling NAND gate 23 for receiving output from the inverter stages and for enabling transmission of the oscillator output.

A disable input 25 receives a disable signal from a control register in the processor (FIG. 6) and passes the signal to inverter 27 (depicted in FIG. 3). The disable signal is $V_{DD}$ or ground. The output from inverter 27 has a high output level equal to control when the disable signal is zero, and a low output level when the disable signal is high.

The output from inverter 27 is delivered to NAND 21. The NAND 21 receives inputs from the control input 19, feedback loop 17, and inverter output 20.

An enable input receives an enable signal from said control register and is the inverse of said disable signal. The enable signal and output signal are directed to NAND 23. When the enable signal is high then the oscillator output signal is allowed to pass.

The VCO further includes a level shifter 31 connecting to stage 16 for adjusting an output signal swing on line 33 to a full $V_{DD}$ signal swing.

The level shifter 31 includes a current mirror comprising transistors 43 and 35 for pulling a low voltage level on node 39 up and a transistor 37 in cooperating relation with said current mirror for pulling a high voltage level on said node 39 down.

Level shifter 31 further includes transistors 45 and 46 connecting to the output of stage 15 and driving transistor 43 in order to adjust said output swing to said full $V_{DD}$ swing in cooperating relation with transistor 37.

Figure 5:
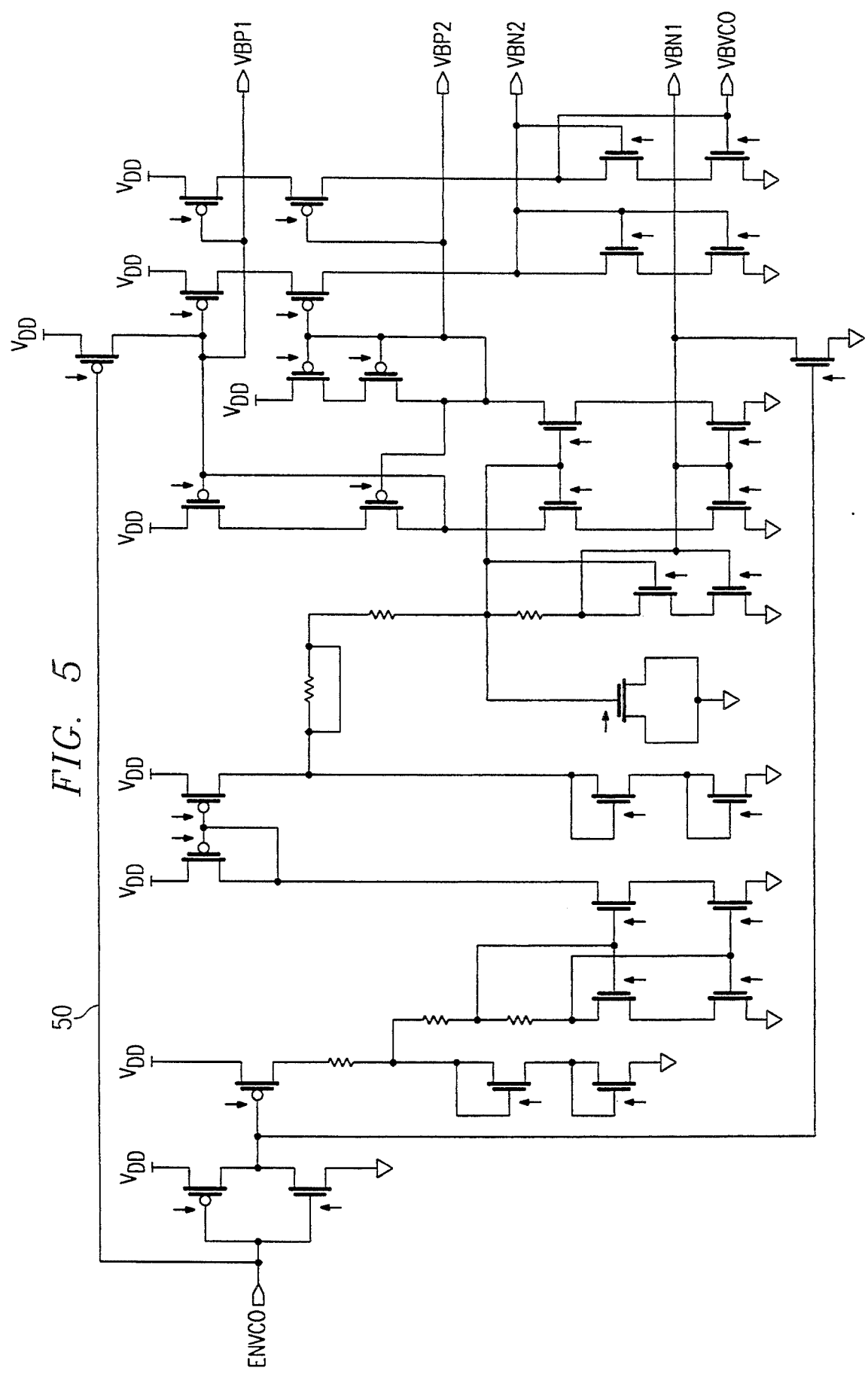
FIG. 5 depicts a bias source for the OPAMP of FIG. 4.

Referring to FIGS. 4 and 5, the VCO is driven by an OPAMP driver 49 which sends said control signal to said control input 19 and filters variation and noise from the input $V_{DD}$ signal. A bias source 50 provides voltage reference levels to OPAMP 49 to determine bias current levels for the OPAMP 49 and level shifter 31.

Figure 6:
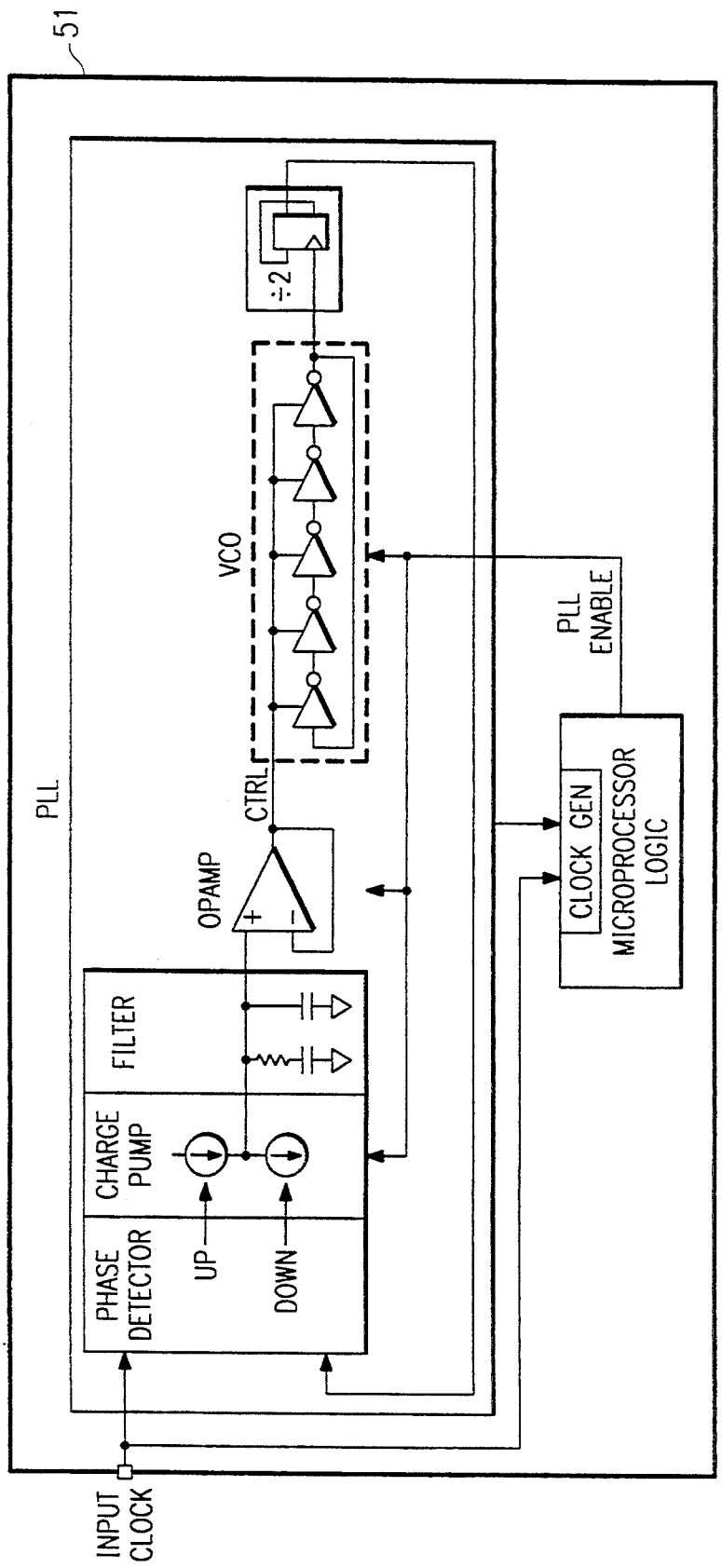
FIG. 6 is a block diagram showing a processor including a PLL.

In FIG. 6, a microprocessor 51 is shown with a voltage-controlled oscillator (VCO) 11 for providing a clock signal for synchronizing operations within said processor.

Figure 7:
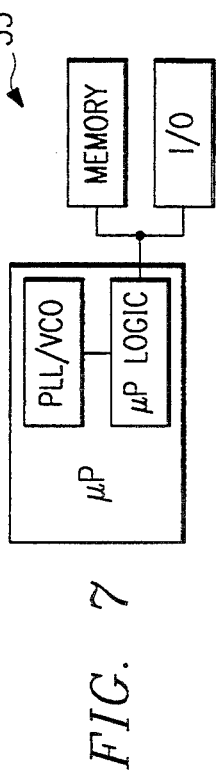
FIG. 7 is a block diagram showing a processing system with a PLL and VCO.

In FIG. 7, a processing system 53 is shown with a voltage-controlled oscillator (VCO) 11 for providing a clock signal for synchronizing operations within said processing system.

When designing phase-locked loops (PLL), the voltage-controlled oscillator (VCO) is often a critical component. It has a frequency/voltage gain coefficient, and also usually has some undesirable gain coefficient with respect to power supply variations. That is, variations in the power supply voltage change the frequency of oscillation of the VCO. When the VCO in a PLL unilaterally changes its frequency, the PLL feedback loop must correct this aberration. Since the unity gain frequency of the PLL feedback is low compared with the oscillating frequency of the VCO, many cycles elapse before the error is eliminated. It is a standard practice in PLL design to utilize a VCO which is as insensitive as possible to variations in the power supply voltage.

The VCO described here has a very good immunity to power supply voltage variations.

The VCO, shown in FIGS. 1, 2, and 3, is a simple five stage ring oscillator, where four stages are inverters, and the fifth is a NAND2 which can disable the VCO's oscillation. In the preferred embodiment, the five stages are implemented with CMOS gates. An NWELL technology is used, with the P-type substrate connected to ground. The positive power supply and wells of the VCO are connected to the CTRL input rather than $V_{DD}$. The frequency of oscillation is a function of the CTRL voltage. In order to eliminate any power supply dependence on the oscillation frequency, the XENVCO enable input signal is sent through an inverter (which translates its output high level to CTRL) before driving the input of the NAND gate. The enable input to the NAND gate therefore has a voltage equal to CTRL when the VCO is enabled. Without this level translation a VCC signal on the NAND would result in power supply dependence of oscillation frequency.

Since the control voltage may be low, a level shifter is needed to bring the output to the full $V_{DD}$ swing. This is simply done with a current mirror pulling the CM2 node up, and a single transistor pulling it down on the opposite phase. The upper frequency of oscillation of the VCO is currently limited to about 200 MHz (100 MHz loop frequency after the divide by 2) by the bias currents in this level shifter, which at frequencies higher than 200 MHz cannot pull CM2 high fast enough. They could easily be adjusted by changing the bias current levels.

The CTRL input to the VCO is driven by an OPAMP, shown in FIG. 4. The internal voltage gain of the OPAMP provides high rejection of changes in the level of $V_{DD}$. The gain at DC might be 100,000, while at higher frequencies the gain is proportional to 1/f, crossing unity gain at many MHz, typically 40–60 MHz. As a result, changes and noise on VDD are high-pass filtered going to the output of the OPAMP. A step change on VDD typically produces a small transient on the OPAMP output. The transient typically has the shape of a small decaying exponential.

While this invention has been described with reference to illustrative embodiments, this description is not intended to be construed in a limiting sense. Various modifications of the illustrative embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. A voltage-controlled oscillator (VCO) with reduced sensitivity to power supply voltage variations, said VCO comprising:
   at least one stage, each said stage including an inverter with a dc power supply input;
   a disabling circuit for disabling frequency oscillation, said disabling circuit including
   a disabling gate connecting to an input of said at least one stage; and
   an enabling gate having an enable input for receiving output from said at least one stage and for enabling transmission of said output from said VCO in response to an enable signal on said enable input;
   a control signal source connected to add power supply, providing a control signal at a voltage level that is substantially independent of said power supply voltage, said control signal source being connected to the dc power supply input of said at least one stage; and
   a disable input element having an input for receiving a disable signal and providing an output signal .representative of said disable signal to an input of said disabling gate, and being coupled to said control signal source such that the output signal of said disable input element is provided at a voltage level that is adjusted in accordance with the voltage level of said control signal.

2. A VCO as in claim 1, said enabling gate including a NAND gate for receiving an input signal from said enable input and a stage output signal from said at least one stage, and for outputting a VCO clock signal.

3. A voltage-controlled oscillator (VCO) according to claim 1, wherein
   said disabling gate comprises a NAND gate; and
   said disable input element comprises an inverter.

4. A voltage-controlled oscillator (VCO) with reduced sensitivity to power supply voltage variations, said VCO comprising:
   at least one stage, each said stage including an inverter with a dc power supply input;
   a disabling circuit for disabling frequency oscillation, said disabling circuit including
   a disabling gate connecting to an input of said at least one stage, and
   an enabling gate having an enable input for receiving output from said at least one stage and for enabling transmission of said output from said VCO in response to an enable signal on said enable input;
   a disable input element having an input for receiving a disable signal and providing an output signal representative of said disable signal to an input of said disabling gate;
   a control signal source connected to a dc power supply, providing a control signal to an input of said disabling gate at a voltage level that is substantially independent of said power supply voltage, said control signal source being connected also to the dc power supply input of said at least one stage.

5. A VCO as in claim 4, said VCO including
   a level shifter including a node connecting to said at least one stage for adjusting an output voltage swing with respect to said node to a full $V_{DD}$ Swing, where $V_{DD}$ is a dc reference supply voltage.

6. A VCO as in claim 5, said level shifter including
   a current mirror for pulling a nodal voltage at said node up; and
   a transistor in cooperating relation with said current mirror for pulling said nodal voltage down.

7. A VCO as in claim 5, said at least one stage including
   a first and a second stage connected in series relation;
   said level shifter including second and third transistors connecting to the output of said first stage for driving a portion of said current mirror in cooperating relation with said transistor.

8. A voltage-controlled oscillator (VCO) according to claim 4, wherein said disable input element is coupled to said control signal source such that the output signal of said disable input element is provided at a voltage level that is adjusted in accordance with the voltage level of said control signal.

9. A voltage-controlled oscillator (VCO) with reduced sensitivity to power supply voltage variations, said VCO comprising:

at least one stage, each said stage including an inverter with a dc power supply input;

a disabling circuit for disabling frequency oscillation, said disabling circuit including a disabling gate connecting to an input of said at least one stage, and an enabling gate having an enable input for receiving output from said at least one stage and for enabling transmission of said output from said VCO in response to an enable signal on said enable input;

a disable input element having an input for receiving a disable signal and providing an output signal representative of said disable signal to an input of said disabling gate;

a control signal source connected to a dc power supply, providing a control signal to an input of said disabling circuit at a voltage level that is substantially independent of said power supply voltage, connected to the dc power supply input of said at least one stage, said control signal source comprising an OPAMP.

10. A voltage-controlled oscillator (VCO) according to claim 9, wherein said disable input element is coupled to said control signal source such that the output signal of said disable input element is provided at a voltage level that is adjusted in accordance with the voltage level of said control signal.

11. A voltage-controlled oscillator (VCO) according to claim 9, wherein said control signal source is connected to an input of said disabling gate.

12. A voltage-controlled oscillator (VCO) with reduced sensitivity to power supply voltage variations, said VCO comprising:

at least one stage, each said stage including an inverter with a dc power supply input;

a disabling circuit for disabling frequency oscillation, said disabling circuit including a disabling gate connecting to an input of said at least one stage, and an enabling gate having an enable input for receiving output from said at least one stage and for enabling transmission of said output from said VCO in response to an enable signal on said enable input;

a disable input element having an input for receiving a disable signal and providing an output signal representative of said disable signal to an input of said disabling gate, and being coupled to a control signal source such that the output signal of said disable input element is provided at a voltage level that is adjusted in accordance with the voltage level of said control signal;

a control signal source connected to a dc power supply, providing a control signal at a voltage level that is substantially independent of said power supply voltage, connected to the dc power supply input of said at least one stage and to an input of said disabling gate, said control signal source comprising an OPAMP.

* * * * *